US007295030B2

(12) United States Patent
Imura et al.

(10) Patent No.: US 7,295,030 B2
(45) Date of Patent: Nov. 13, 2007

(54) THIN FILM TRANSISTOR TESTER AND CORRESPONDING TEST METHOD

(75) Inventors: Kenichi Imura, Yasu-gun (JP); Daiju Nakano, Sagamihara (JP); Yoshitami Sakaguchi, Hadano (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/163,996

(22) Filed: Nov. 7, 2005

(65) Prior Publication Data

US 2006/0097745 A1 May 11, 2006

(30) Foreign Application Priority Data

Nov. 8, 2004 (JP) ............................ 2004-323556

(51) Int. Cl.
*G01R 31/26* (2006.01)

(52) U.S. Cl. ...................................... 324/765; 324/770

(58) Field of Classification Search .................... None
See application file for complete search history.

(56) References Cited

U.S. PATENT DOCUMENTS

| | | | | |
|---|---|---|---|---|
| 4,378,629 | A * | 4/1983 | Bozler et al. | 438/347 |
| 5,537,054 | A * | 7/1996 | Suzuki et al. | 324/770 |
| 6,011,404 | A * | 1/2000 | Ma et al. | 324/765 |
| 6,207,468 | B1 * | 3/2001 | Chacon et al. | 438/17 |
| 6,504,393 | B1 * | 1/2003 | Lo et al. | 324/765 |
| 6,597,193 | B2 * | 7/2003 | Lagowski et al. | 324/765 |
| 6,664,800 | B2 * | 12/2003 | Chacon et al. | 324/765 |
| 6,734,696 | B2 * | 5/2004 | Horner et al. | 324/765 |
| 6,909,302 | B2 * | 6/2005 | Kamieniecki et al. | 324/765 |
| 6,937,050 | B1 * | 8/2005 | Fung et al. | 324/765 |
| 2005/0104614 | A1 * | 5/2005 | Sakaguchi et al. | 324/765 |
| 2006/0022696 | A1 * | 2/2006 | Nystrom et al. | 324/765 |

FOREIGN PATENT DOCUMENTS

| | | |
|---|---|---|
| JP | 2002072918 A | 3/2002 |
| JP | 2002108243 A | 4/2002 |
| JP | 2002123190 A | 4/2002 |

* cited by examiner

*Primary Examiner*—Paresh Patel
*Assistant Examiner*—Richard Isla-Rodas
(74) *Attorney, Agent, or Firm*—H. Daniel Schnurmann

(57) ABSTRACT

To test electrical characteristics of a Thin Film Transistor (TFT) with a source or drain terminal left open and exposed, using a non-contact current source and protecting the TFTs from adverse effects, such as contamination, destruction, and the like. A tester 100 is provided to test a TFT array substrate 14, the tester including ion flow supply devices 16 and 18 for supplying an ion flow onto the surface of a substrate 14. Thereon, an array 12 of TFTs is formed, each TFT being connected to an electrode having a source or a drain left open and exposed; a control circuit 24 for supplying an operating voltage to a gate electrode of the TFT to be tested in the array; and a measurement circuit 24 for measuring an operating current via the testing TFT source or drain that remain in a non open state.

17 Claims, 11 Drawing Sheets

INTEGRATING CIRCUIT 1

INTEGRATING CIRCUIT 2

CURRENT MEASUREMENT CIRCUIT EXAMPLE 1

CURRENT MEASUREMENT CIRCUIT EXAMPLE 2

DIRECT-CURRENT TYPE

ALTERNATING-CURRENT TYPE

RECTANGULAR-WAVE TYPE

THIN FILM TRANSISTOR TESTER AND CORRESPONDING TEST METHOD

BACKGROUND OF THE INVENTION

The present invention generally relates to a Thin Film Transistor (TFT) tester and a TFT test methodology, and more particularly, to an apparatus and method for testing the operating characteristics of a TFT array using a non-contact voltage or current source.

The steps for manufacturing an organic light emitting diode (OLED) display (hereinafter referred to as an AMOLED display) of an active matrix are roughly divided into a 'TFT array step' of forming a TFT array for driving purposes, and a subsequent 'cell step' of forming the OLED on the array. At the stage at which the formation of the TFT array ends, the OLED which consists of a light emitting material, is not made on the TFT array substrate. Therefore, any circuit built therewith is inadequate to be used as a pixel circuit. Thus, only when the TFT array is formed, a drain or source of the TFT that is connected to an exposed pixel electrode is brought into an open state. Therefore, any operating current cannot pass (i.e., be turn on) through the TFT. As a result, at the stage where the TFT array step ends, it is impossible or very difficult to test the TFT electrical characteristics. Consequently, the characteristics of the AMOLED display required to complete the AMOLED display are usually obtained only after the cell step has concluded.

When the TFT array is tested following the TFT array step, any defective TFT array is prevented from being supplied to the cell step. As a result, the yield of the AMOLED display after the process has been completed is significantly higher, and a reduction in manufacturing costs can be anticipated. Since fluctuations of the TFT electrical characteristics seriously and adversely affect the image quality of the AMOLED display, there is a strong demand for performing the parametric tests at the TFT array stage.

By way of example, in Japanese Patent Application Laid-Open Nos. 2002-72918, 2002-108243, and 2002-123190, a method is disclosed in which current passes through a pixel electrode connected to the source or drain of the TFT used for driving and having an open state.

In Japanese Patent Application Laid-Open No. 2002-72918, a method is disclosed wherein the TFT array is immersed in an electrolytic solution to achieve electric conduction. Since the TFT array requires a full immersion in the solution, the method described is not actually used in a manufacturing line.

In Japanese Patent Application Laid-Open No. 2002-108243, a method is described in which the pixel electrode is tested before patterning. The method described also discloses forming and testing a conductive film on the pixel electrode, and the conductive film used for testing is removed after testing has been completed. However, the conductive film is stacked and formed on the TFT array and brought in close contact with the pixel electrode. Therefore, there is a danger that the TFT array will be damaged when forming the conductive film when tested on the TFT array and/or when removing the film. Therefore, there is little likelihood that such a method will actually be employed in a manufacturing processing line.

In Japanese Patent Application Laid-Open No. 2002-123190, a method is described in which an electrode is positioned in the upper portion of the TFT array substrate, and air between the substrate and the electrode is irradiated with an electromagnetic wave (soft X-ray) to ionize the air, such that electric conduction is achieved. However, during this process, the TFT array substrate is also irradiated with X-rays. Therefore, when too much current passes, the exposure of X-ray on the TFT element increases, and there is a possibility of the element breaking. The tester using soft X-ray requires a certain level of caution when handling it, special equipment is required to prevent exposure to the surrounding environment or operator, and further, it is not easy to perform. Therefore, there is little likelihood that this approach could be used in a manufacturing process.

OBJECTS AND SUMMARY OF THE INVENTION

Accordingly, it is an object of the present invention to test the electrical characteristics of a TFT having an open and exposed source or drain electrode using a non-contact current source without having an adverse effect on the TFT, such as contamination, destruction, and the like.

It is another object of the present invention to provide an apparatus and a method for testing the electrical characteristics of the TFT in the manufacturing line of a TFT array.

According to the present invention, there is provided a TFT tester that includes: an ion flow supply means for supplying the ion flow to a substrate where a TFT is formed, with the source or the drain left open and exposed; a control circuit for supplying an operating voltage to the TFT gate electrode; and a measuring circuit for measuring an operating current via the other TFT electrode that remain not open.

According to another aspect of the invention, there is provided a TFT array substrate tester, that includes an ion flow supply means for supplying an ion flow to a substrate where a TFT array is formed, each TFT being connected to an electrode, with the source or drain left open and exposed; a control circuit for supplying an operating voltage to the TFT gate electrode to be tested in the array; and a measuring circuit for measuring the operating current via testing the TFT source or drain that is not open.

In still another aspect of the invention, the TFT test method includes the steps of: (a) preparing a substrate where a TFT is formed with the source or drain left open and exposed; (b) supplying an ion flow to a substrate where the TFT is formed; (c) supplying an operating voltage to the TFT gate electrode; and (d) measuring an operating current via the TFT electrode that is not open.

According to yet another aspect of the invention, there is provided a TFT array substrate test method that includes the steps of: (a) providing a substrate where a TFT array is formed, each TFT being connected to an electrode, having the source or the drain remaining open and exposed; (b) supplying an ion flow to the substrate where the TFT array is formed; (c) supplying an operating voltage to the TFT gate electrode to be tested in the array; (d) measuring an operating current via the testing TFT source or drain not open; and (e) measuring a surface potential of the exposed electrode.

The tester and test method of a TFT array substrate of the present invention are capable of testing the electrical characteristics of the TFT without having adverse effects (contamination, destruction, etc.) on the TFT, by supplying an ion flow to an open and exposed source or drain of the TFT. Furthermore, the apparatus and method of the present invention make it possible to test the electrical characteristics of the TFT by using an existing TFT drive circuit in an existing manufacturing line.

DETAILED DESCRIPTION OF THE INVENTION

Figure 1:
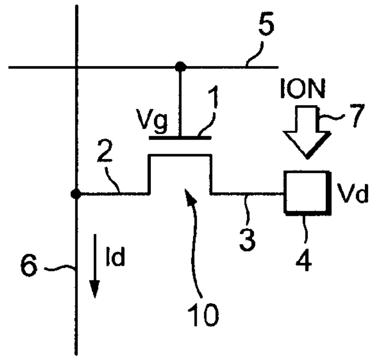
FIG. 1 is a diagram showing a TFT as a test object.

Referring now to FIG. 1, there is shown a diagram illustrating an N-channel TFT used as the device to be tested. Gate 1 of TFT 10 is connected to a driving voltage line 5. Either source or drain 2 is attached to current detection line 6, while 3 is connected to an open electrode 4. Since electrode 4 is open, TFT 10 does not operate even when a driving voltage is applied to gate 1. Moreover, the driving current cannot be detected from line 6. In the present invention, the open electrode 4 is irradiated by an ion flow 7. The ion flow 7 operates as a TFT voltage source (current source). When an operating voltage Vg is supplied to gate 1, TFT 10 turns on. When the TFT turns on, an operating current Id is detected by line 6. Furthermore, the surface potential Vd of electrode 4 is measured. The electrical characteristics of TFT 10 are checked from the driving voltage Vg, the operating current Id, or the surface potential Vd and the potential Vs of the current detection line, to further determine whether or not the characteristics are satisfactory. Practitioners of the art will readily recognize that if the TFT to be measured is a P-channel type, similar measurements can be performed. It is to be noted that since electrode 4 needs to receive ions, at least a part of the surface needs to remain exposed. The size of the exposed area for operating the TFT is a function of the ion flow density.

Figure 2:
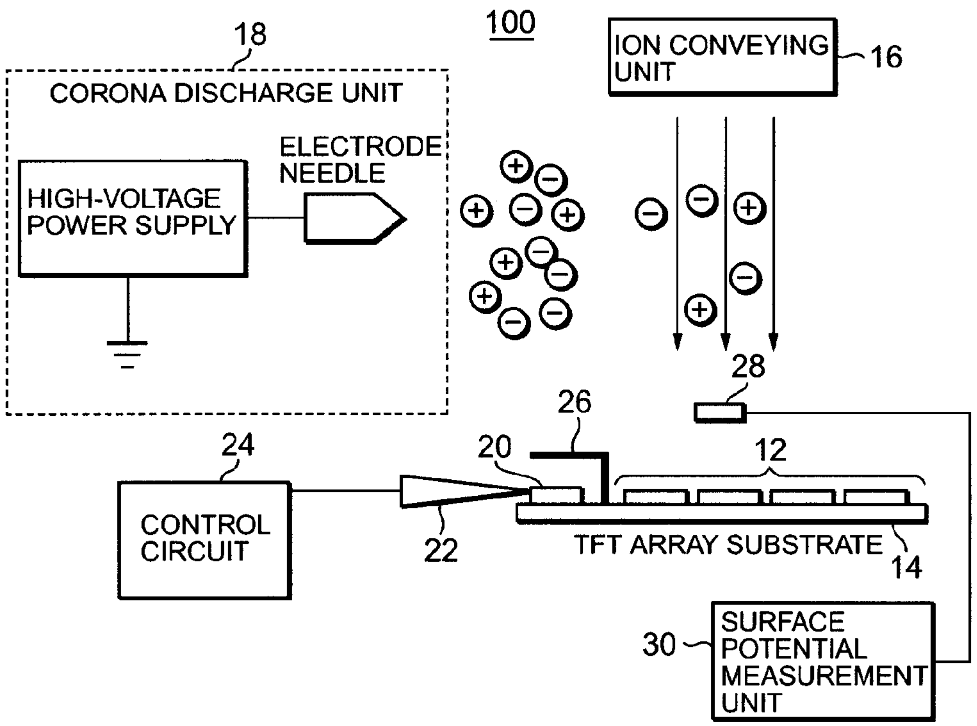
FIG. 2 is a block diagram showing the tester configuration, according to the present invention.

Referring now to FIG. 2, there is shown a block diagram depicting the preferred configuration of tester 100, according to the present invention. It is worth noting that the configuration to be described hereinafter is for illustrative purposes only and concerns mainly testing a TFT array substrate of the AMOLED display. The tester can be used equally well for testing a TFT having an open and exposed source or drain electrode for any application, as well as for an array substrate, and the like.

An ion conveying unit 16 for supplying an ion flow is positioned above substrate 14 wherein the TFT array 12 is to be formed. A corona discharge unit 18 is positioned preferably at the left side of the ion conveying unit 16. The ion conveying unit 16 and the corona discharge unit 18 provide the ion flow for supplying the ion flow to the substrate. A measurement control circuit 24 is electrically connected to an electrode pad 20 placed at the left end of the substrate 14 via probe 22. The measurement control circuit 24 controls the driving of the TFT array (supplying of the gate voltage Vg to the TFT to be tested), the measuring of the operating current Id or the like. The electrode pad 20 is covered with ion flow shielding means 26 to prevent irradiation by the ion flow. Furthermore, above the substrate, a sensor head 28 is positioned for detecting the surface potential of the open electrode of the TFT array, and a surface potential measurement unit 30 for receiving a signal from the sensor head 28.

Figure 3:
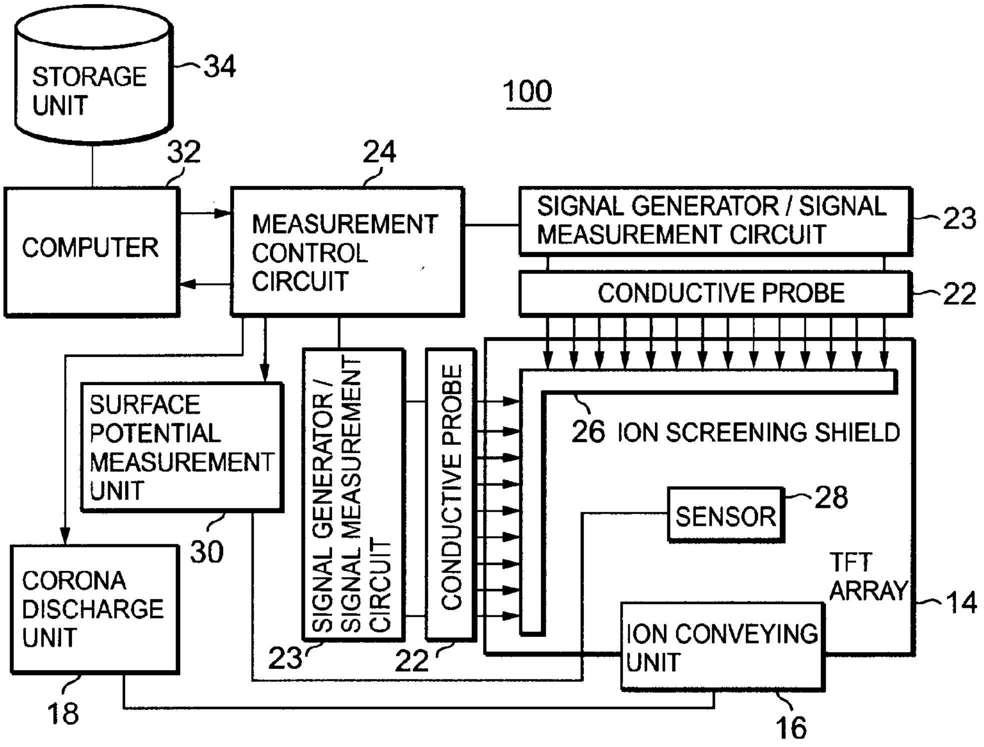
FIG. 3 is a block diagram showing the system architecture of the tester of the present invention.

Referring now to FIG. 3, there is shown a block diagram illustrating the preferred system architecture of the tester 100 of the present invention. Components denoted with the like numerals as those of FIG. 2 reference the same tester elements discussed previously. FIG. 3 shows a signal generation measurement circuit 23, a PC 32 for calculating the electrical characteristics and a storage unit 34. It is to be noted that the signal generation measurement circuit 23 utilizes a portion of the peripheral circuit of the TFT array. The probe 22 preferably has an ion shielding function (details of which will be described hereinafter).

Next, a preferred test procedure will be described using the tester of FIGS. 2 and 3. Ions are sprayed by way of the corona discharge unit 18 and the ion conveying unit 16 onto the substrate to be tested to form the voltage source. The resulting configuration allows testing the pixel circuit.

Figure 4:
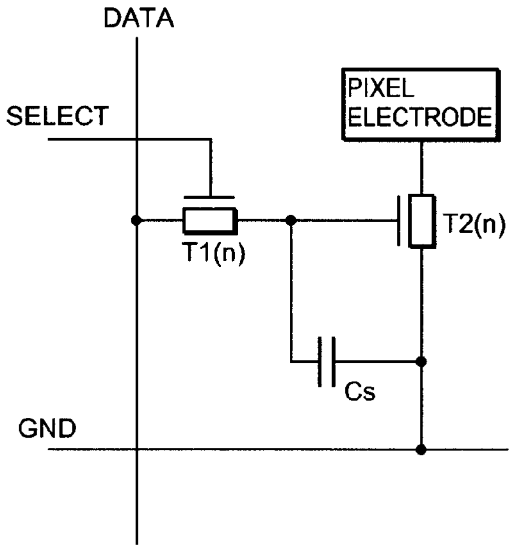
FIG. 4 is a schematic diagram of a TFT circuit used in an AMOLED display.

Referring to FIG. 4, an example is shown of a preferred pixel circuit for use in the AMOLED display. The pixel circuit preferably consists of two N-channel TFTs (T1, T2) which is representative of a simple pixel circuit for programming a voltage. The driving TFT (T2) includes a transistor which determines the image quality of the OLED panel, the object of which is to test the electrical characteristics of the TFT.

Figure 5:
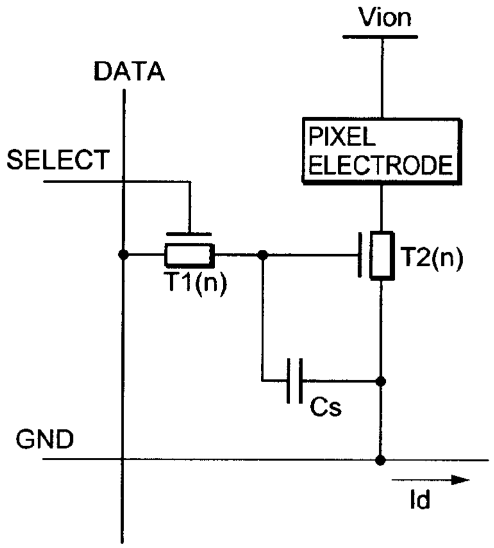
FIG. 5 is a diagram showing the circuit of FIG. 4 in an electrically conducting state.
Figure 6A:
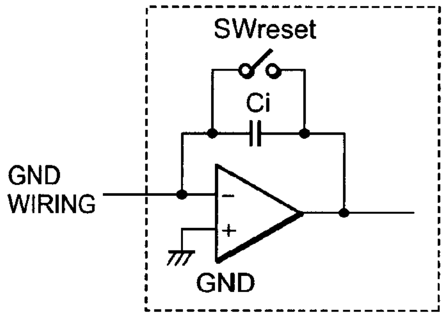
FIG. 6 is a diagram showing an example of a current measurement circuit.
Figure 6B:
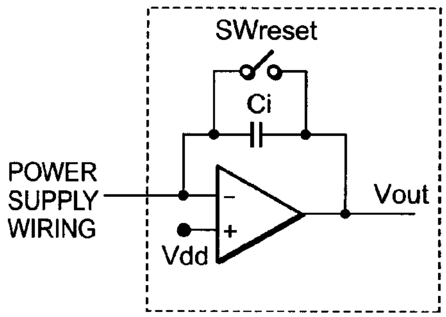
Figure 6C:
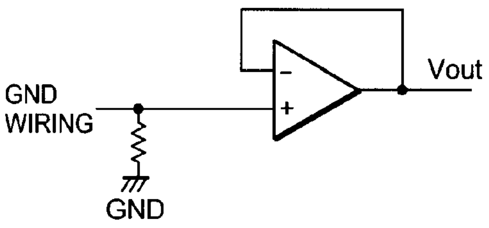
Figure 6D:
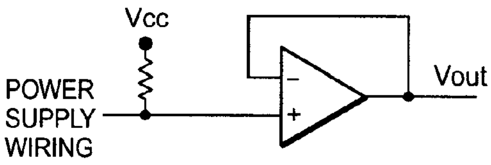

The pixel electrode is connected to the drain side of T2, and an OLED material is formed such as to allow connecting an opposite electrode to a power supply. Since the OLED is not formed in an array state, the pixel electrode remains exposed, and the electrode remains with the drain open. When ionized air is supplied to conduct electricity, the state changes to the one illustrated in FIG. 5. This state coincides with the state in which a potential Vion is applied to the pixel electrode. The electrode is connected to the peripheral circuit 23 (FIG. 3) via probe 22 (FIG. 3) for power conduction, driving the pixel. A select line and a data line are driven in the same manner as in a usual operation, and the current is confirmed by a GND line. In order to test the current, an ammeter may be directly connected to the GND line. Any of the circuits illustrated in FIGS. 6(*a*) to (*d*) is usable for measuring the current.

Figure 7:
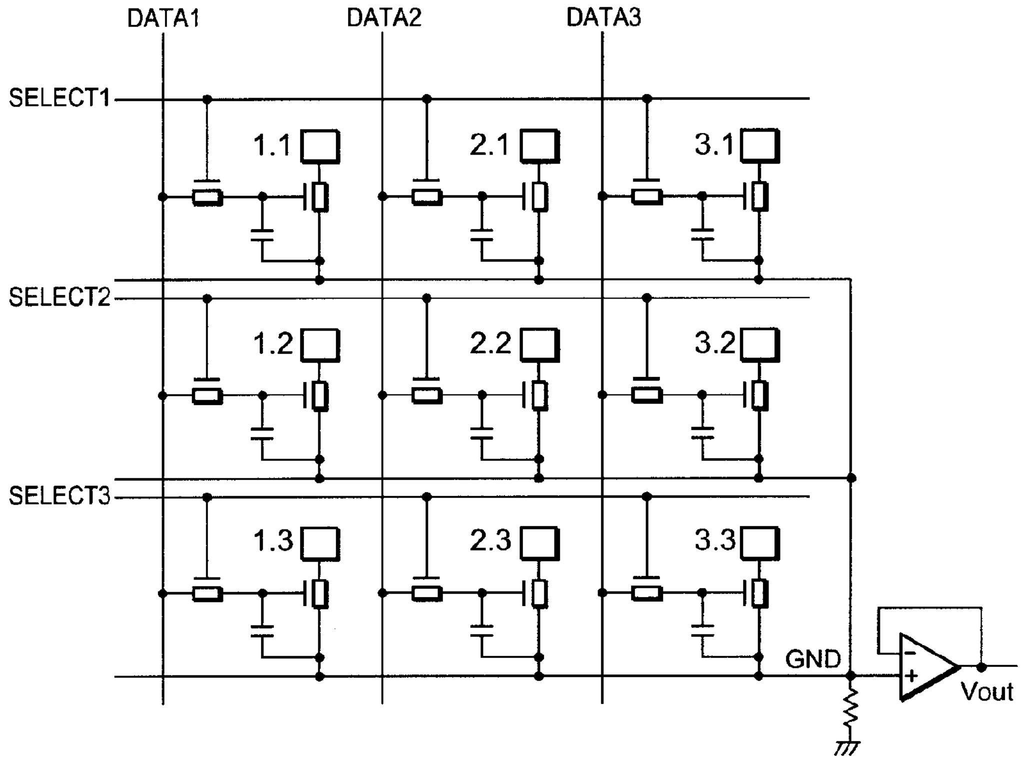
FIG. 7 is a diagram showing the TFT circuits of FIG. 4 arranged in a 3 by 3 array formation.
Figure 8:
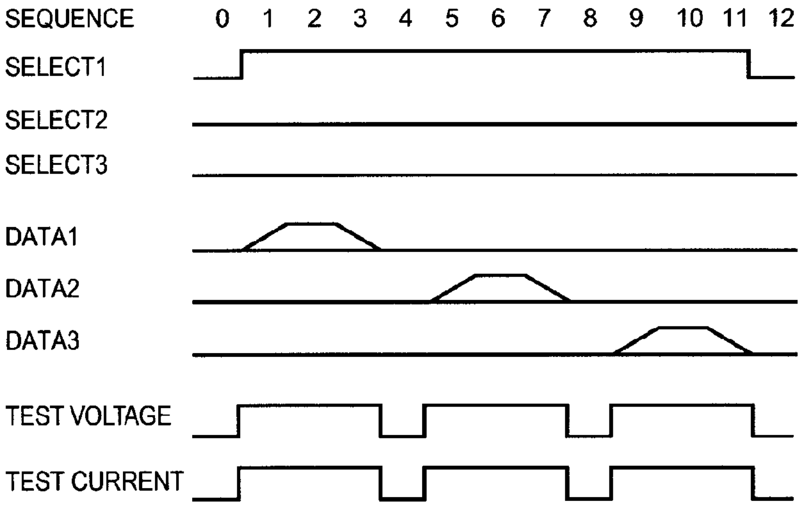
FIG. 8 is a diagram showing a sequence of driving waveforms at each line of the circuit shown in FIG. 7 during testing.

FIG. 7 illustrates a 3 by 3 array arrangement of TFT circuits. Shown in FIG. 8 is a sequence of driving waveforms for each line of the circuit shown in FIG. 7 during testing.

The Test Flow

Hereinafter is shown a sequence of steps illustrating the preferred test flow.

(a) A conductive probe 22 (FIG. 3) is connected to the electrode pad 20 (FIG. 2) and a current measurement circuit is attached to a wire leading to the GND line. Sensor electrode 28 (FIG. 3) of the surface potential measurement unit is positioned on the testing substrate 14 (FIG. 3).

(b) The corona discharge unit 18 (FIG. 2 and the ion conveying unit 16 (FIG. 2) are turned on to start supplying ionized air.

(c) Select line Select1 of a testing pixel 1.1 is turned on (sequence 1, FIG. 8).

(d) A signal voltage is applied to data line Data1 of testing pixel 1.1. The potential of the pixel electrode is measured by surface potential measurement unit 30, and the current Id flowing through the GND line is measured (sequences 1 to 3 of FIG. 8).

(e) A signal voltage is applied to data line Data2 of the next testing pixel 2.1. The potential of the pixel electrode is measured by the surface potential measurement unit 30. Similarly, the current flowing through the GND line is likewise also measured (sequences 5 to 7 of FIG. 8).

(f) A signal voltage is applied to data line Data3 of the next testing pixel 3.1. The potential of the pixel electrode is measured by the surface potential measurement unit 30. The current flowing through the GND line is then measured (sequences 9 to 11 of FIG. 8).

(g) The select line Select1 is turned off (sequence 12 of FIG. 8).

(h) The next select line Select2 is turned on, and the above steps (c) to (g) are repeated.

(i) The select line Select3 is turned on, and the above steps (c) to (g) are repeated.

When the above procedure is replicated, Vion=Vd, Vg, and the current Id passing through the transistor T2 are measured. Accordingly, an Id–Vgs curve is obtained. In the present case, since Vs is the potential of the GND line, Vgs=Vs. The electrical characteristic parameters b and Vth can be obtained with respect to the transistor T2 from the Id–Vgs curve, wherein b depicts a value determined by the mobility m of the TFT, the gate capacity Cox per unit area, and a ratio of the channel width W to the channel length L of the TFT. The value of b is calculated by the following equation:

$$b=m\mathrm{Cox}(W/L).$$

Furthermore, in the saturated region of the transistor, $$Id=0.5b(Vgs-Vth)^2$$

is determined by relating Id to Vgs. As indicated by the test condition with respect to b and Vth, one may check whether or not they fall within a range arbitrarily set by the user, or fluctuations in all the pixels are evaluated.

As described above, according to the tester and method of the present invention, the electrical characteristics of the driving TFT in the pixel circuit are measured. More particularly, Vds, Vgs, and current Id can be measured by driving the driving TFT.

When ionized air is used as a means for conducting electricity to the open electrode, the electrode can be used as a voltage source, but it is difficult to hold the voltage constant. When a constant voltage cannot be held, a predetermined voltage can then be obtained from the surface potential measurement unit.

Figure 9:
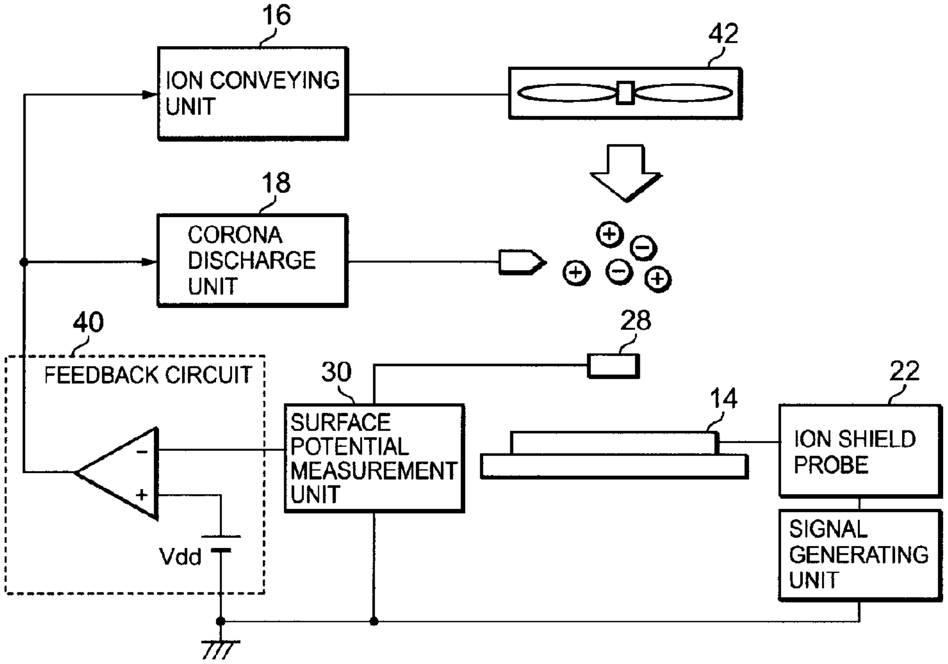
FIG. 9 is a schematic diagram showing the state of the feedback control.

FIG. 9 is a schematic diagram showing the feedback control for keeping the surface potential at a constant value. The voltage obtained by the surface potential measurement unit 30 is inputted into feedback circuit 40 consisting of an operational amplifier, and the value is fed back to the ion conveying unit 16 or the corona discharge unit 18 to keep the surface potential constant.

Referring to the corona discharge unit 18, the feedback circuit 40 controls the voltage value or the current value which is applied to a needlepoint electrode (FIG. 2). Regarding the ion conveying unit 16, the flow rate of the air blowing fan 42 is controlled. If compressed air is used, then air pressure is controlled. A valve is preferably placed between the ion conveying unit 16 and the testing substrate 14 for controlling the opening and closing of the valve.

Next, each element of the tester of the present invention will be described in detail.

Corona Discharge Unit (18)

A corona discharge is an electric discharge phenomenon in a section of the apparatus in the form of a needlepoint electrode having a large curvature. The discharge is a local electric discharge. This discharge, which is one mode of electric discharge, is referred to as local destruction. The discharge is usually caused when a high voltage of ranging between 3 kV and 10 kV is applied to the needlepoint electrode at normal temperature/pressure in air. When the corona discharge occurs, the air surrounding the needlepoint electrode becomes ionized. When the voltage applied is negative, negative ions are generated. When the applied voltage is positive, positive ions are created. In air, nitrogen turns into negative ions, while steam turns into positive ions. If the absence of any electric or magnetic field, the generated ions float in the surrounding area, and are adsorbed by another material while recombined. The ions discharge electric charges when adsorbed, and transfer the charges to the material which has adsorbed the ions. When the target that has adsorbed the ions is grounded by a conductor, a current is generated. The material is charged when ions are adsorbed by a material such as a non-grounded conductor or insulator.

Figure 10A:
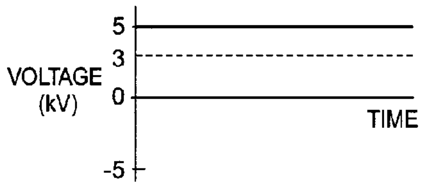
FIG. 10 is a diagram showing the voltage sequence at an electrode of the corona discharge unit.
Figure 10C:
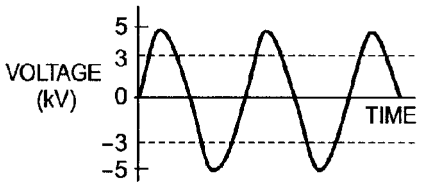
Figure 10B:
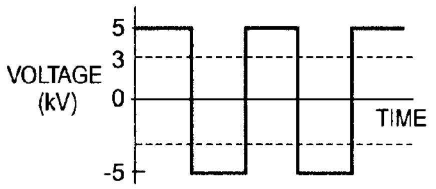

The apparatus of the present invention is comparatively simply, and preferably includes a needlepoint electrode and a high-voltage power supply (18 in FIG. 1). In the sequence for applying a high voltage, either an AC or DC voltage may be applied as shown in the driving waveforms illustrated in FIG. 10. In 10(*a*), the application of a DC voltage of 5 kV is shown. Since the voltage exceeds the threshold voltage of 3 kV in starting the corona discharge, an electric discharge is continuously generated. In this case, only positive ions are generated. Therefore, a needlepoint electrode for applying a negative voltage is separately set, provided the apparatus allows for a plurality of electrodes. In 10(*b*), a rectangular wave is applied. In this case, positive/negative ions are generated from a needlepoint electrode. In 10(*c*), an AC voltage is applied. Particularly, when a high frequency (10 kHz to 100 kHz) is applied, it is possible to obtain a well-balanced state of positive/negative ions also with regard to time. In any case, there is preferably an equal amount of positive/negative ions in the atmosphere in which the pixel electrode is brought in contact, and it is necessary to supply ions at high density as a function of time.

The high density of ions as a function of time shows the amount of charge, i.e., the current of ions received by the testing substrate per second. Since the ions generated in the tester of the present invention operate as a current supply source, adequate current must be secured. Specifically, the current may surpass the upper limit of about 5 mA. Therefore, an ion flow which is capable of conveying about 5 micro coulombs (μC) of electric charges per second is supplied. To generate ions at high density for a predetermined time, the voltage is set to be as high as possible, and a plurality of needlepoint electrodes are set and simultaneously driven. When the ion density increases, the recombination ratio correspondingly also increases. To solve this problem, ions are continuously supplied to the testing substrate from the periphery of the needlepoint electrode by ion conveying unit 16, to be described hereinafter. Accordingly, the ion density in the vicinity of the needlepoint electrode is kept at a constant low state, while the ion density on the testing substrate is held at high.

Ion Conveying Unit (16)

Ionized air generated by the corona discharge unit 18 is conveyed onto the testing substrate by ion conveying unit 16. The corona discharge unit is provided with the high-voltage needlepoint electrode. Therefore, when the testing substrate is in close proximity thereof, the high voltage plays an influential role and the element on the substrate breaks, creating a likelihood for a wrong operation at the tester to occur. There is also a possibility that the testing substrate picks up electromagnetic noises from the corona discharge. Therefore, the distance from the testing substrate needs to be as large as possible. However, when the distance increases, an adequate amount of ions does not reach the testing substrate, and the current required for a correct operation of the TFT cannot be secured. To solve this problem, air is supplied by the ion conveying unit. Basically, a flow of air is generated and the ions are displaced by the air flow. To that effect, a fan or compressed air is used. Air to be ionized is supplied around the needlepoint electrode of the corona discharge unit 18, and ionized air is then provided.

Ion Shielding Probes (26, 22)

There exists a method wherein amorphous silicon is used and a process in which polysilicon is employed to form the TFT in the AMOLED array substrate. When the TFT array uses amorphous silicon, electrode pads are placed along the edges of the substrate with as many probes coinciding with the pixels arranged in a matrix formation. A flexible substrate or the like is used to connect a source driver, and a gate driver connected to the pads. For a TFT array employing polysilicon, generally the driver circuit is advantageously formed on the same substrate. An electrode pad that supplies the electrical signals required to activate the driver is placed at the edge of the substrate. To test the TFT for each pixel on the test substrate, signals are sent from the electrode pad for signal supply drawn out to the edge portion, and the pixel is driven directly or through a peripheral circuit.

A probe is usually used wherein probe needles are arranged to match the pitch of the electrode pads. Tungsten is often used as the preferred material for the needle point. This probe is physically brought in contact with the electrode pad to allow electric conduction, but the electrode pad and the probe are usually brought into an exposed state in air. Therefore, when electricity is conducted by ionized air, there is a possibility that the ionized air directly injects the electric charge from the probe needle, and therefore air cannot be used. To solve this problem, the probe needs to be provided with a mechanism for shielding the ionized air.

Figure 11:
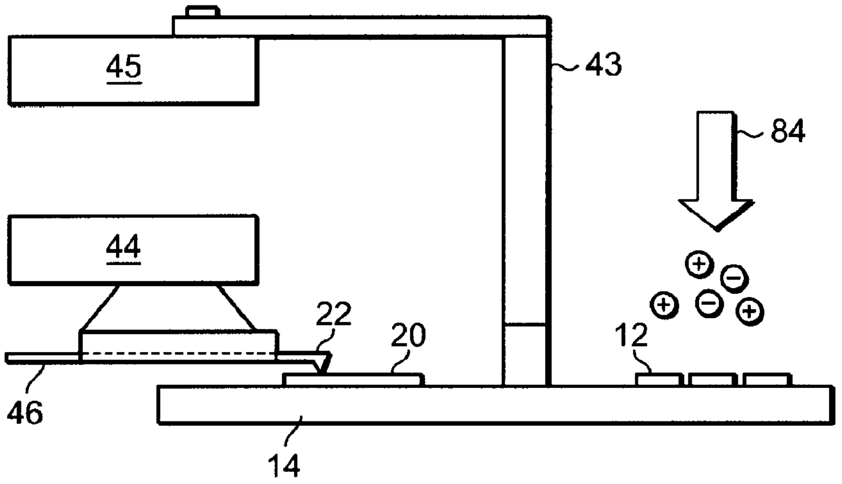
FIG. 11 is a diagram showing an example of an ion interrupting probe.

FIG. 11 shows an example of a probe provided with a cover that physically shields the probe from the ionized air. The preferred materials for an ion shielding cover 43 include a conductive or an insulating material, preferably in a non-grounded state. When the conductor is at ground, ionized air is sucked in, and the ion density on the testing substrate decreases. As to the ionized air, the positive/negative electrically charged ions are balanced in such a way that the charge decreases to zero. Therefore, the charges do not increase even when the conductor or the insulator is not grounded. When the conductor is not to be grounded, preferably an insulator such as plastic is used for the cover.

Independent from shaft 44 for probe 22, a shaft 45 capable of performing an XYZ-qj rotation is attached to the ion shielding cover 43, and the ion shielding cover 43 is disposed in such a manner as to hold the cover between the substrate and the probe by the shaft. After placing the ion shielding cover 43, the probe 22 that provides electric conduction is brought in contact with the electrode pad 20. The probe 22 is provided with a flexible cable 46 and is positioned above the electrode pad 20. If an alignment mark has not been set, the probe needs to be brought in contact with the electrode pad 20 while also determining the exact position of the pad by way of a camera and the like. Therefore, in this case, the ion shielding cover 43 needs to be transparent. The ion shielding cover 43 is brought in contact with the testing substrate 14 or it is disposed in the vicinity of the substrate leaving a small gap. When the cover is brought in contact, the cover preferably has edges formed of materials such as soft rubber and plastic.

Surface Potential Measurment Unit (28,30)

There exist known techniques and corresponding measuring methods to effectively use the surface potential measurement unit and data processing unit. Generally, a unit measuring the potential of the insulator charged with static electricity and using a vibrating condenser is preferably used.

Figure 12:
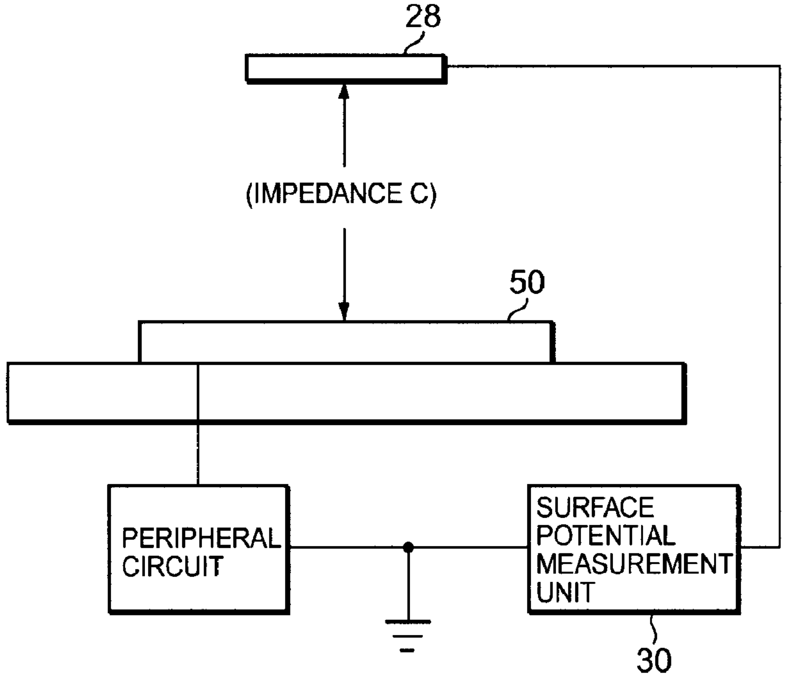
FIG. 12 is a schematic diagram showing a surface potential measurement by way of a vibrating condenser method.

Referring now to FIG. 12, there is shown a schematic diagram illustrating the vibrating condenser method. Therein, a sensor electrode 28 is positioned in the vicinity of a measurement object 50, and the sensor electrode 28 is vibrated to change the capacity c formed between the sensor electrode and the measurement object. An alternating-current potential generated by the sensor electrode is measured in accordance with the capacity change to obtain the potential of the measurement object. Typically, there are 100,000 or more pixel electrodes on the TFT array substrate of the AMOLED display, and the potentials of the electrodes need to be independently obtained. Then, each sensor electrode is miniaturized to a size ranging between 50 $mm^2$ to 100 $mm^2$ approximately equal to that of the pixel electrode, and the surface of the array substrate is scanned. A distance between the testing substrate and the sensor electrode is preferably as small as possible, and specifically the distance is preferably 500 mm or less.

Figure 13:
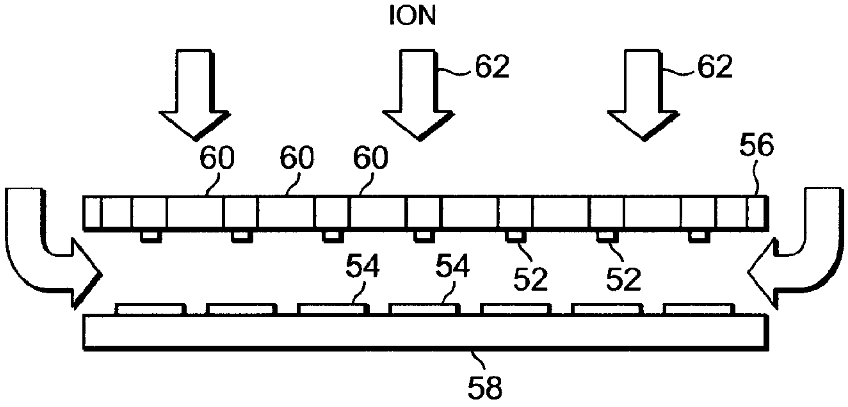
FIG. 13 is a schematic diagram showing the surface potential measurement by the vibrating condenser method.

Alternatively, as shown in FIG. 13, sensor electrodes 52 are arranged beforehand in a matrix matching the arrangement of pixel electrodes 54 for substrate 56, and the substrate is placed in the vicinity of testing substrate 58. In this case, the sensor electrodes 52 are separated from one another via air holes or grooves 60, and a structure is achieved through which an ion flow 62 easily passes.

Other illustrative examples will be described with respect to several elements of the tester of the present invention.

Ion Conveying Unit (16)

Figure 14:
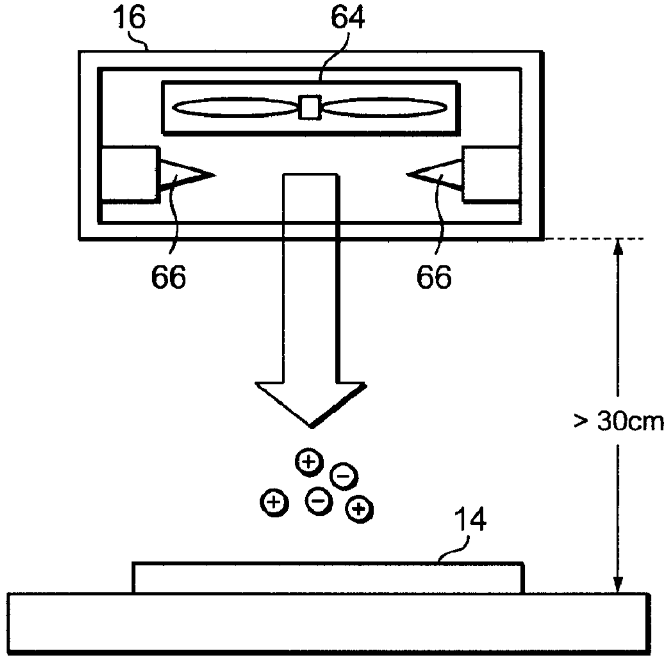
FIG. 14 is a diagram showing a first example of an ion conveying unit.
Figure 15:
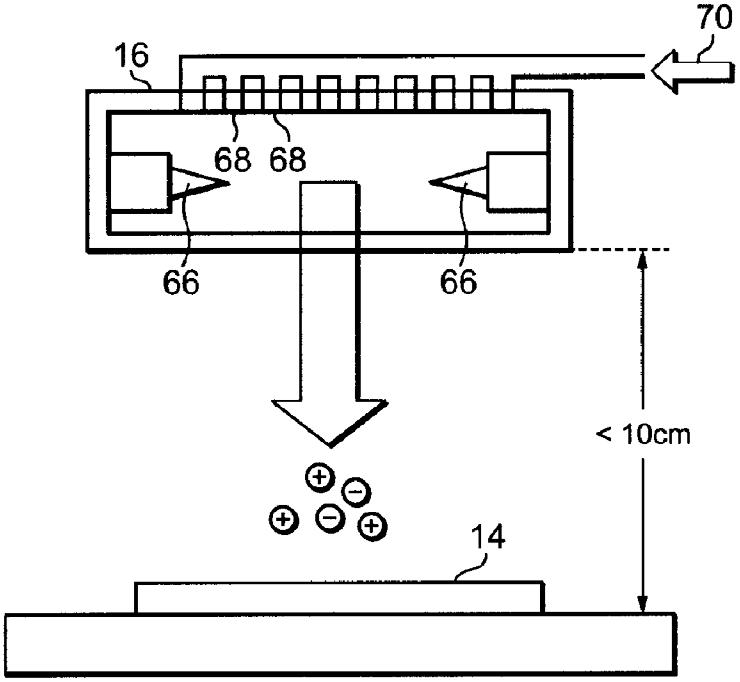
FIG. 15 is a diagram showing a second example of the ion conveying unit.

FIG. 14 shows the use of an air blowing fan 64. The unit is preferably structured to be integrated with the needlepoint electrodes 66 of the corona discharge unit. Since there are electromagnetic noises caused by a rotary motor of the fan 64, a distance of 30 cm or more from the testing substrate needs to be taken. As shown in FIG. 15, compressed air 70 may be supplied via air holes 68 instead of an air blowing fan. Accordingly, since the electromagnetic noises of the fan can be avoided, and the distance can further be reduced, a high ion density can be generated.

Figure 16:
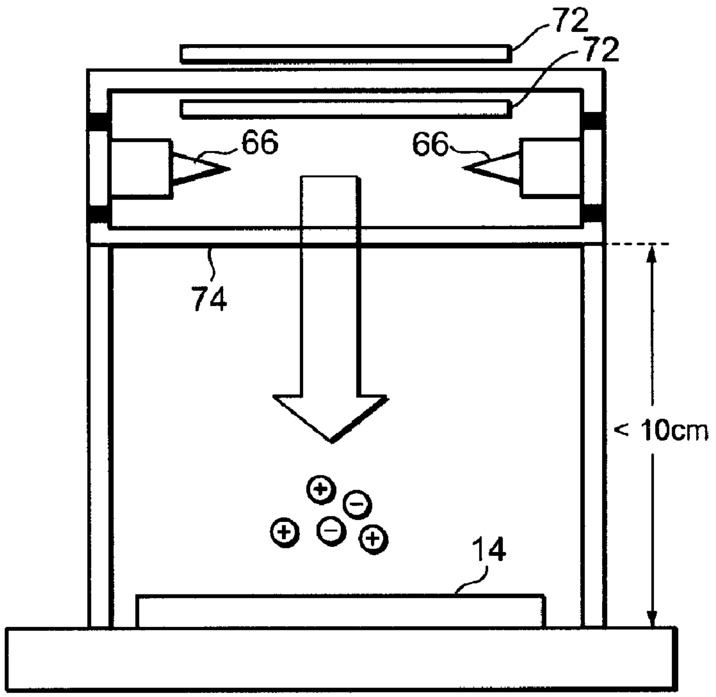
FIG. 16 is a diagram showing a third example of the ion conveying unit.

FIG. 16 illustrates another example. Magnetic stirrers 72 using a magnetic force are used to rotate the air blowing fan. The fan is placed in the same housing 74 as the needlepoint electrodes 66 to provide an electric discharge. A magnetic rotor for the rotating fan is disposed outside the housing. When the housing 74 is made of metal, the electromagnetic noises of the magnetic rotor can be stopped. Since the electromagnetic noises can be interrupted, the fan can be disposed in the vicinity of the testing substrate 14.

Figure 17:
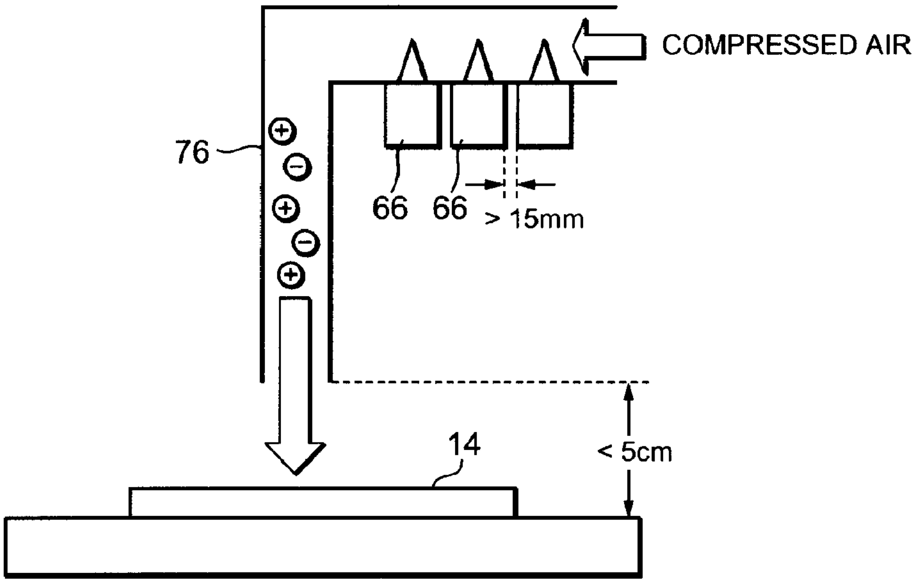
FIG. 17 is a diagram showing a fourth example of the ion conveying unit.

FIG. 17 shows yet another example. An air supply tube 76 conveying ionized air is employed, and compressed air flows inside the tube. The needlepoint electrodes 66 of the corona discharge unit are positioned within the tube. The compressed air is ionized while flowing through the tube, and is conveyed onto the testing substrate 14 through the tube. An inner-diameter size of the tube 76 is set to a size of about 100 mm, approximately equal to the dimensions of the pixel to a size (diagonal size of about 2 inches for a cellular phone and about 20 inches for a monitor) approximately equal to that of the testing substrate. When the inner diameter of the tube is smaller than the size of the testing substrate, a stage is laid on the testing substrate, or a tube tip is scanned to perform electric conduction by ionized air with respect to all the pixels.

Figure 18:
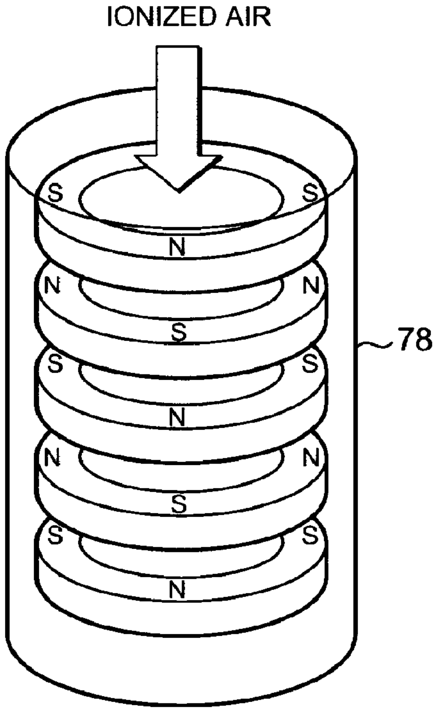
FIG. 18 is a diagram showing an example of an air supply tube for supplying ionized air.

To convey the ionized air through the air supply tube, the tube is preferably formed into a confined tube 78 by a magnetic force, as shown in FIG. 18. In the tube, quadruple magnets are stacked upon one another in such a manner that the N and S poles are alternately arranged, and the tube has a function of confining positively or negatively charged ionized air inside the tube. Specifically, since a circular magnetic field is generated, the ions traveling inside the tube receive a Lorentz force and undergo a force directed toward the middle of the tube or outwards. However, in case where the magnetic field increases by the square of the radius in a radial direction from a tube central portion, a confining effect is produced. As seen in FIG. 18, the magnetic field can be approximately provided. Needless to say, the number of N and S poles may be increased to obtain octopoles.

Ion Shielding Probes (6,22)

Figure 19:
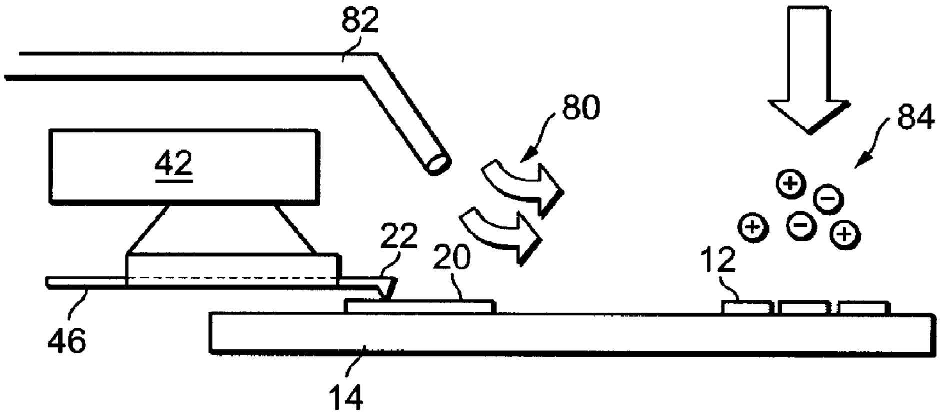
FIG. 19 is a diagram showing an example of an ion shielding probe.

FIG. 19 shows an example of an ion shielding probe. The probe is integrated with probes 22, 46 providing electric conduction, and a tube 82 is attached for blowing compressed air 80. The compressed air 80 flows toward the testing substrate 14 from a probe 22, providing an air curtain. Ions 84 conveyed from above the testing substrate 14 are to be kept away from the contacting probe 22 and the electrode pad 20. Air blown simply flows on the testing substrate 14, and performs the function of stirring positive/negative ions to keep an ion balance.

Figure 20:
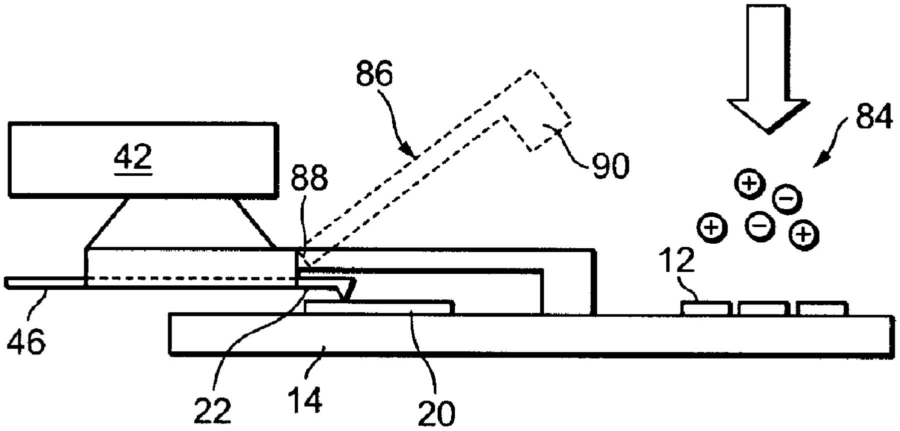
FIG. 20 is a diagram showing an example of the ion shielding probe.

FIG. 20 shows still another example of the ion shielding probe. The probe 22 for electric conduction is integrated, and an ion shielding cover 86 is positioned in such a manner that it covers the probe needle. A root 88 of the cover 86 has a hinge structure, and vertically rotates. A limiter 90 is positioned in a lower part of the probe in such a manner as to prevent the cover from being brought in contact with the probe for electric conduction, and the cover can freely rotate upwards. To bring the probe in contact with the electrode pad, the ion shielding cover 86 first contacts the pad. Thereafter, the needle of the probe 22 for electric conduction is brought in contact. The ion shielding cover 86 is preferably made of an insulator and a soft material such as plastic and rubber is preferably used especially in the portion brought in contact with the substrate.

Feedback Control

In the example shown in FIG. 9, the amount of ions which form the electric conduction media is controlled by unit 18 for producing ionized air, and unit 16 for conveying air that controls the surface potential (potential of the pixel electrode) to remain constant, but the response is slow, and this control is not suitable for measurement at a high speed. For measurements at the high speed, the method is more effective when a control signal from the feedback circuit 40 is an input to the pixel circuit through the ion shielding probe 22. In this case, the surface potential is not constant, but Vds and Vgs applied to the drive TFT are controlled and kept a constant value.

Figure 21:
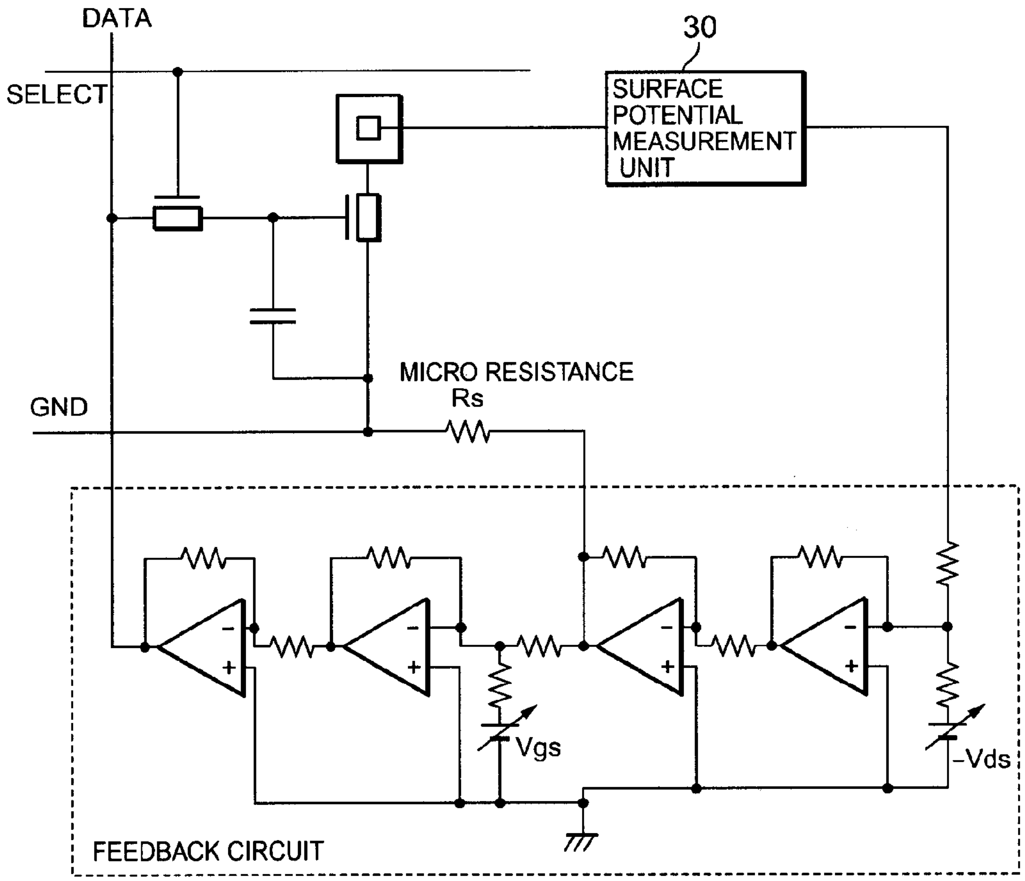
FIG. 21 is a diagram showing an example of a feedback control circuit.

FIG. 21 shows an illustrative circuit. A potential obtained by the surface using potential measurement unit 30 as a reference, a voltage lowered by Vds by using the reference is applied to the GND wiring, and a voltage which is higher than that applied to the GND wiring by Vgs is applied to the data line. In this case, Vds and Vgs can be set to be constant. A micro-resistance Rs is inserted between the GND wiring and the feedback circuit, and voltages on opposite ends are measured to obtain a current value Id. An Id-Vgs curve is obtained from this current value.

Where the present invention has been described with reference to various examples, it is understood that the invention is not limited to those examples which are provided only for illustrative purposes. I will be apparent to those skilled in the art that changes and modifications are possible without departing from the scope of the present invention.

What is claimed is:

1. A tester, comprising:

ion flow supply means for supplying an ion flow to a surface of a substrate where a thin film transistor (TFT) is tested either with a source electrode or a drain electrode remaining open;

a control circuit for supplying an operating voltage to a TFT gate electrode; and a measuring circuit for measuring an operating current flowing through either the TFT source electrode or the drain electrode that is not open.

2. The tester according to claim 1, further comprising:

a surface potential measuring unit for measuring a surface potential of the exposed electrode of the TFT in a non-contact manner.

3. The tester according to claim 1, wherein the ion flow supply comprises:

a corona discharge unit for producing ionized air; and an ionized air conveying unit for feeding the ionized air to the surface of the substrate.

4. The tester according to claim 2, further comprising:

a feedback circuit for setting the surface potential to control an ion flow rate from the ion flow supply device.

5. The tester according to claim 1, further comprising:

ion flow shielding for protecting an electrode terminal from irradiation with the ion flow, the electrode terminal being electrically connected to the TFT electrode that is not open to measure the operating current.

6. A thin film transistor (TFT) array substrate tester, comprising:

an ion flow supply device for supplying an ion flow to a surface of a substrate where a TFT array is formed, each TFT being respectively connected to an electrode with either a source or a drain remaining open;

a control circuit for supplying an operating voltage to the TFT gate electrode to be tested in the array; and a measuring circuit for measuring an operating current flowing through either the TFT source electrode or the drain electrode that is not open.

7. The FTF array tester according to claim 6, further comprising:

a surface potential measuring unit for measuring a surface potential of the exposed electrode in a non-contact manner.

8. The TFT array tester according to claim 7, further comprising:

a computing unit for obtaining electrical characteristics of the testing TFT from the operating voltage, the operating current, and the surface potential.

9. The FTF array tester according to claim 6, wherein the ion flow supply device comprises: a corona discharge unit for producing ionized air; and an ionized air conveying unit for feeding the ionized air to the surface of the substrate.

10. The FTF array tester according to claim 7, further comprising:

a feedback circuit for receiving the surface potential to control an ion flow rate from the ion flow supply device.

11. The FTF array tester according to claim 6, further comprising:

ion flow shielding means for protecting an electrode from irradiation with the ion flow, the electrode being electrically connected to the testing TFT source or drain not open to measure the operating current.

12. A test method customized to test thin film transistors (TFT), comprising the steps of:

(a) providing a substrate where a TFT is formed with its source electrode or drain electrode remaining open;

(b) supplying an ion flow to a surface of the substrate where the TFT is to be formed;

(c) supplying an operating voltage to the TFT gate electrode;

(d) measuring an operating current via the TFT electrode that is not open; and (e) displaying the measured current value on a display.

13. The test method according to claim 12, wherein step (d) further comprises the step of:

measuring a surface potential of the exposed electrode of the TFT.

14. A thin film transistor (TFT) array substrate test method, comprising the steps of:

(a) providing a substrate where a TFT array is formed, each TFT being connected to an electrode with one of a source and a drain open and exposed;

(b) supplying an ion flow to a surface of the substrate where the TFT array is formed;

(c) supplying an operating voltage to the TFT gate electrode to be tested in the array;

(d) measuring an operating current via the testing TFT source or drain not open;

(e) measuring a surface potential of the exposed electrode; and (f) displaying the measured operating current value on a display.

15. The test method according to claim 14, further comprising the step of:

(g) measuring and displaying electrical characteristics of the testing TFT from the operating voltage, the operating current, and the surface potential.

16. The test method according to claim 14, wherein step (e) further comprises the step of:

controlling an ion flow rate to be supplied to the surface of the substrate based on the measured surface potential.

17. The test method according to claim 14, further comprising the steps of:

repeating the measuring steps (d) and (e) until the measuring ends with respect to all the TFTs in the array.

* * * * *